(12) United States Patent
Fattaruso (10) Patent No.: US 7,116,169 B2
(45) Date of Patent: Oct. 3, 2006

(54) DRIVER APPARATUS AND METHOD OF OPERATION THEREOF

(75) Inventor: John W. Fattaruso, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/865,140

(22) Filed: Jun. 10, 2004

(65) Prior Publication Data

US 2005/0275457 A1 Dec. 15, 2005

(51) Int. Cl.
*H03F 3/45* (2006.01)
(52) U.S. Cl. .................................. 330/252; 330/261
(58) Field of Classification Search ............... 330/252, 330/257
See application file for complete search history.

(56) References Cited

U.S. PATENT DOCUMENTS 5,119,041 A * 6/1992 Hanna ..................... 330/252
5,706,236 A * 1/1998 Yamamoto ................. 330/252
6,392,452 B1 * 5/2002 Lee .......................... 330/252
2005/0088232 A1 * 4/2005 Christensen ............... 330/252

* cited by examiner

*Primary Examiner*—Khanh Van Nguyen
(74) *Attorney, Agent, or Firm*—J. Dennis Moore; W. James Brady; Frederick J. Telecky, Jr.

(57) ABSTRACT

A driver apparatus comprising a signal switching circuit coupled for receiving an actuation signal and generating a first and a second control signal in response to the actuation signal; a first control circuit and a second control circuit coupled with the signal switching circuit; the first and second control circuits generating first and second drive control signals in response to the first and second control signals; first and second current generating circuits coupled with the first and second control circuits and coupled with a lower voltage rail; the first and second current generating circuits presenting first and second drive signals at first and second output loci in response to the first and second drive control signals.

19 Claims, 4 Drawing Sheets

FIG. 5

DRIVER APPARATUS AND METHOD OF OPERATION THEREOF

BACKGROUND OF THE INVENTION

The present invention is directed to electrical driver apparatuses used for driving electronic devices, such as laser diode devices. The present invention is especially directed to driver apparatuses having low minimum driver signal voltages in high speed bipolar circuits.

In present day driver apparatuses, there is a need for providing AC (alternating current) coupling between a driver apparatus and the device that is driven by the driver apparatus. This is so in order to maintain appropriate voltage at a driver transistor in order to avoid operating the driver transistor in saturation, which would significantly slow the operation of the driver apparatus. A consequence of having to establish AC coupling in order to keep a driver transistor from operating in saturation is that extra components must be included that reduce the overall system performance and increase the overall system cost.

Prior art driver apparatuses are commonly configured to employ driving a differential pair of bipolar transistors to generate the required drive signals. Driving a differential pair of bipolar transistors with high speed switching causes a prominent overshoot in collector current of the respective transistor of the driven transistor pair that is turning on. The overshoot distorts the driver signals from the ideal step current waveform that is desired so that error rates may be minimized.

There is a need for a driver apparatus that avoids the necessity of providing AC coupling with a driven device.

There is a need for a driver apparatus that exhibits a lower minimum drive potential than is attainable by prior art drive apparatuses in order to better accommodate low supply voltage limits.

There is a need for a driver apparatus that avoids driving a differential pair of bipolar transistors with high speed switching in order to avoid overshoot in collector current of the respective transistor of the driven transistor pair that is turning on.

SUMMARY OF THE INVENTION

A driver apparatus comprising a signal switching circuit coupled for receiving an actuation signal and generating a first and a second control signal in response to the actuation signal; a first control circuit and a second control circuit coupled with the signal switching circuit; the first and second control circuits generating first and second drive control signals in response to the first and second control signals; first and second current generating circuits coupled with the first and second control circuits and coupled with a lower voltage rail; the first and second current generating circuits presenting first and second drive signals at first and second output loci in response to the first and second drive control signals.

A method for providing a drive signal; the method comprising the steps of: (a) in no particular order: (1) providing a signal switching circuit coupled for receiving an actuation signal; (2) providing a first control circuit coupled with the signal switching circuit; (3) providing a second control circuit coupled with the signal switching circuit; (4) providing a first current generating circuit coupled with the first control circuit and coupled with a lower voltage rail; and (5) providing a second current generating circuit coupled with the second control circuit and coupled with the lower voltage rail; (b) operating the signal switching circuit to generate a first control signal and a second control signal in response to the actuation signal; (c) in no particular order: (1) operating the first control circuit to generate a first drive control signal in response to the first control signal; and (2) operating the second control circuit to generate a second drive control signal in response to the second control signal; (d) in no particular order: (1) operating the first current generating circuit to present a first drive signal at a first output locus in response to the first drive control signal; and (2) the second current generating circuit to present a second drive signal at a second output locus in response to the second drive control signal.

It is, therefore, an object of the present invention to provide a driver apparatus and method of operation thereof that avoids the necessity of providing AC coupling with a driven device.

It is a further object of the present invention to provide a driver apparatus and method of operation thereof that exhibits a lower minimum drive potential than is attainable by prior art drive apparatuses in order to better accommodate low supply voltage limits.

It is yet a further object of the present invention to provide a driver apparatus and method of operation thereof that that avoids driving a differential pair of bipolar transistors with high speed switching in order to avoid overshoot in collector current of the respective transistor of the driven transistor pair that is turning on.

Further objects and features of the present invention will be apparent from the following specification and claims when considered in connection with the accompanying drawings, in which like elements are labeled using like reference numerals in the various figures, illustrating the preferred embodiments of the invention.

DETAILED DESCRIPTION OF THE PREFERRED EMBODIMENT

Figure 1:
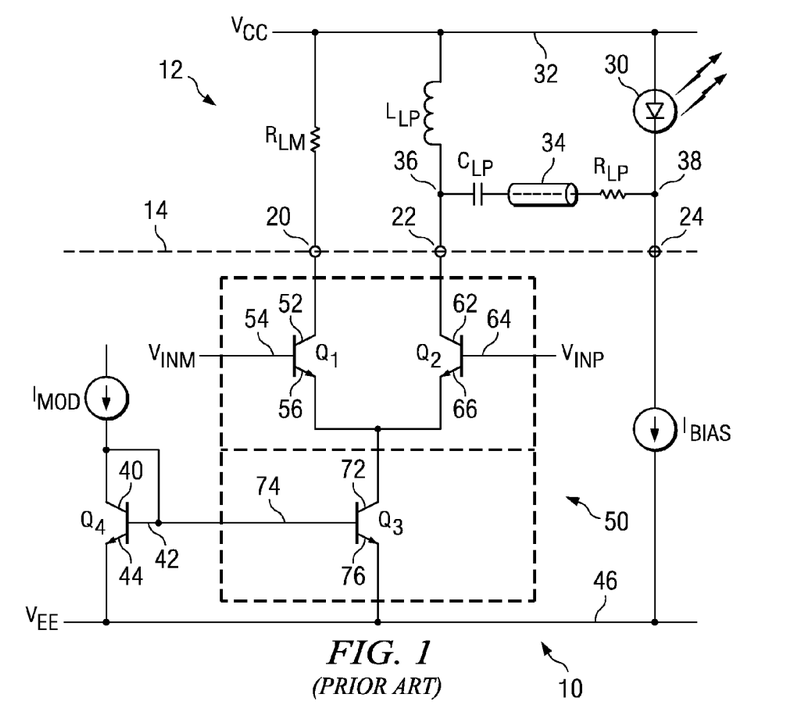
FIG. 1 is an electrical schematic diagram of a prior art driver apparatus.

FIG. 1 is an electrical schematic diagram of a prior art driver apparatus. In FIG. 1, a driver apparatus 10 is configured and connected to drive a driven device 12. In FIG. 1, a border 14 of driver apparatus 10 is indicated by a dotted line. Driven device 12 is connected with driver apparatus 10 using connecting pins 20, 22, 24. Driven device 12 includes a laser diode 30 coupled with an upper voltage rail 32 at an upper rail potential or supply voltage $V_{CC}$ and coupled with connecting pin 24. An inductor $L_{LP}$ is coupled between upper voltage rail 32 and connecting pin 22. A capacitor $C_{LP}$, a transmission line 34 and a resistor $R_{LP}$ are connected in series between connection loci 36, 38. A resistor $R_{LM}$ is coupled between upper voltage rail 32 and connecting pin 20.

Driver apparatus 10 includes a current source $I_{MOD}$ coupled with a transistor $Q_4$. Transistor $Q_4$ has a collector

40, a base 42 and an emitter 44. Transistor $Q_4$ is diode coupled with collector 40 connected with base 42. Emitter 44 is coupled with a lower voltage rail 46. Current source $I_{MOD}$ may be coupled with upper voltage rail 32 via a connection pin (not shown in FIG. 1).

Driver apparatus 10 also includes a differential transistor pair 50. Differential transistor pair 50 includes transistors $Q_1$, $Q_2$. Transistor $Q_1$ has a collector 52, a base 54 and an emitter 56. Transistor $Q_2$ has a collector 62, a base 64 and an emitter 66. Collector 52 of transistor $Q_1$ is coupled with connecting pin 20. Collector 62 of transistor $Q_2$ is coupled with connecting pin 22. Base 54 of transistor $Q_1$ receives an input signal $V_{INM}$. Base 64 of transistor $Q_2$ receives an input signal $V_{INP}$. Emitters 56, 66 are coupled in common with a collector 72 of a transistor $Q_3$. Transistor $Q_3$ has a base 74 and an emitter 76. Base 74 is coupled with base 42 of diode-connected transistor $Q_4$ so that transistors $Q_3$, $Q_4$ operate as a current mirror so that current source $I_{MOD}$ effectively sets current that traverses transistor $Q_3$. Emitter 76 of transistor $Q_3$ is coupled with lower voltage rail 46.

Driver apparatus 10 also includes a bias current source $I_{BIAS}$ coupled between connecting pin 24 and lower voltage rail 46.

Laser diode 30 is biased into low intensity light emission by bias current source $I_{BIAS}$, and digital information is provided differentially to bases 54, 64 by input signals $V_{INM}$, $V_{INP}$. Differential transistor pair 50 switches the tail current through transistor $Q_3$ to follow the digital bits provided by input signals $V_{INM}$, $V_{INP}$. Resistor $R_{LP}$ is employed to make incremental impedance of laser diode 30 appear as a resistive load to terminate transmission line 34. Transistor $R_{LM}$ is employed as a dummy load to present a balanced differential load to driver apparatus 10. High intensity light is emitted from laser diode 30 when the digital bit provided by input signal $V_{INP}$ at base 64 of transistor $Q_2$ is high. The level of modulation current that may be switched into laser diode 30 is set by current source $I_{MOD}$, as it is scaled up by current mirror $Q_4$, $Q_3$.

Driver apparatus 10 suffers several drawbacks. In practice, outputs to laser diode 30 at connecting pin 22 must be presented with resistive load $R_{LP}$ along transmission line 34 with characteristic impedance in the range of about 20 to 50 ohms. A laser diode 30 designed for optical networking at distances greater than one kilometer must be driven on and off with modulation currents of several tens of milliamperes. These parametric characteristics in turn require that voltage swing at collector 62 of transistor $Q_2$ can be as high as one or two volts. This can be a problem because voltage at collector 62 must be maintained at greater than approximately one volt above lower voltage rail potential $V_{EE}$ to avoid running either transistor $Q_2$, $Q_3$ in its respective saturation region. Operating either transistor $Q_2$, $Q_3$ in its saturation region significantly reduces speed of operation of driver apparatus 10. A typical voltage drop across laser diode 30 is about one volt. Today's low voltage processes and products often establish upper voltage rail potential $V_{CC}$ at 3.3 volts. As a consequence, AC (alternate current) coupling is employed with driver apparatus 10, as embodied in capacitor $C_{LP}$. Capacitor $C_{LP}$ isolates collector 62 from the DC voltage drop across laser diode 30 while effecting AC coupling with laser diode 30 for purposes of applying drive signals to laser diode 30 in response to drive signal $V_{INP}$. Inductor $L_{LP}$ assures that the DC voltage at collector 62 remains substantially at upper rail potential $V_{CC}$.

It would be advantageous if a driver apparatus could operate at a lower minimum voltage without risking operating drive transistors in saturation while not hindering the speed of the driving operation.

If AC coupling were not provided in the prior art circuit arrangement illustrated in FIG. 1, collector 62 may be coupled via transmission line 34 directly to laser diode 30. Such a connection would place another one volt drop on collector 62, and would therefore increase the likelihood that transistor $Q_2$ would be required to operate in its saturation region, with an attendant decrease in speed. However, establishing the required AC coupling between driver apparatus 10 and laser diode 30 requires extra parts, thereby raising the cost of driven device 12, and also disturbs transmission line 34 with reflecting discontinuities.

Moreover, it is known that driving a differential pair, such as transistor differential pair 50, with high speed switching causes a prominent overshoot in the collector current of the respective transistor $Q_1$, $Q_2$ that is turning on. This overshoot is a problem with the prior art circuit arrangement illustrated in FIG. 1 as it distorts the desired ideal step current waveform that is desired to minimize the optical error rate by driven module 12.

Figure 2:
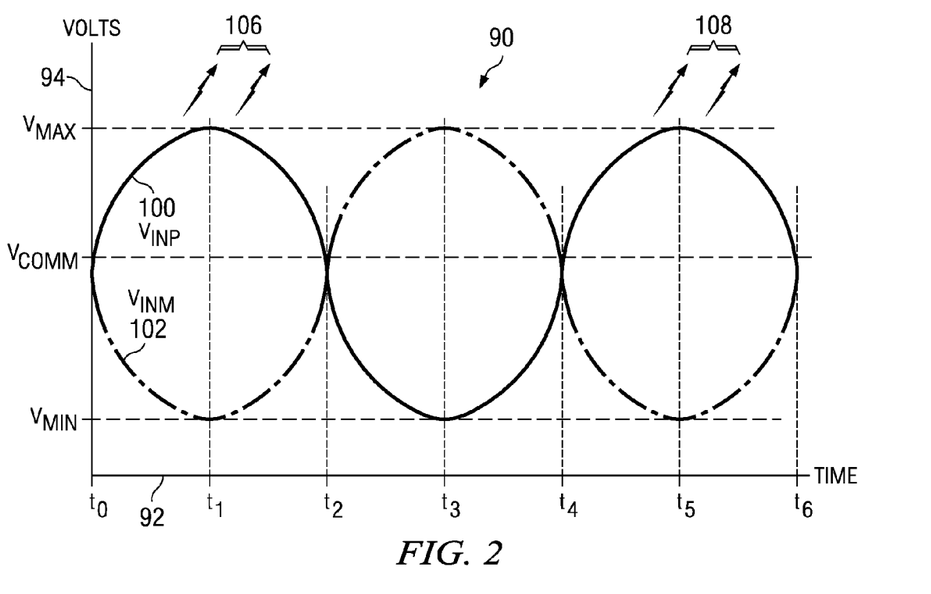
FIG. 2 is a graphical representation of selected signals associated with the driver apparatus illustrated in FIG. 1.

FIG. 2 is a graphical representation of selected signals associated with the driver apparatus illustrated in FIG. 1. In FIG. 2, a graph 90 is presented plotted against a horizontal 92 axis representing time and a vertical axis 94 representing voltage. A first curve 100 represents input signal $V_{INP}$. A second curve 102 represents input signal $V_{INM}$. Curves 100, 102 vary between a maximum value $V_{MAX}$ and a minimum value $V_{MIN}$. As input signal $V_{INP}$ increases toward $V_{MAX}$ in the vicinity of time $t_1$, transistor $Q_2$ (FIG. 1) is turned on and current flows through transistor $Q_2$. The current is AC coupled with laser diode 30 via capacitor $C_{LP}$, transmission line 34 and resistor $R_{LP}$ to effect illumination by laser diode 30, as indicated by light indicators 106. After time $t_1$, input signal curve 100 representing input signal $V_{INP}$ decreases, and curve 102 representing input signal $V_{INM}$ increases. Both curves 100, 102 are at a minimum value $V_{COMM}$ (common mode voltage) at time $t_2$. At time $t_3$, curve 102 representing input signal $V_{INM}$ is at a maximum value and in that region transistor $Q_1$ is turned on. This causes a current to flow through transistor $Q_1$, and through dummy load transistor $R_{LM}$. Around time $t_3$, curve 100 representing input signal $V_{INP}$ is at a minimum value near or at $V_{MIN}$ and transistor $Q_2$ is turned off so diode 30 is not illuminated. The pattern repeats as time passes so that at time $t_4$, both curves 100, 102 are at a minimum value $V_{COMM}$. Around time $t_5$, transistor $Q_2$ is turned on again and current flows through transistor $Q_2$. The current is AC coupled with laser diode 30 via capacitor $C_{LP}$, transmission line 34 and resistor $R_{LP}$ to effect illumination by laser diode 30, as indicated by light indicators 108.

Figure 3:
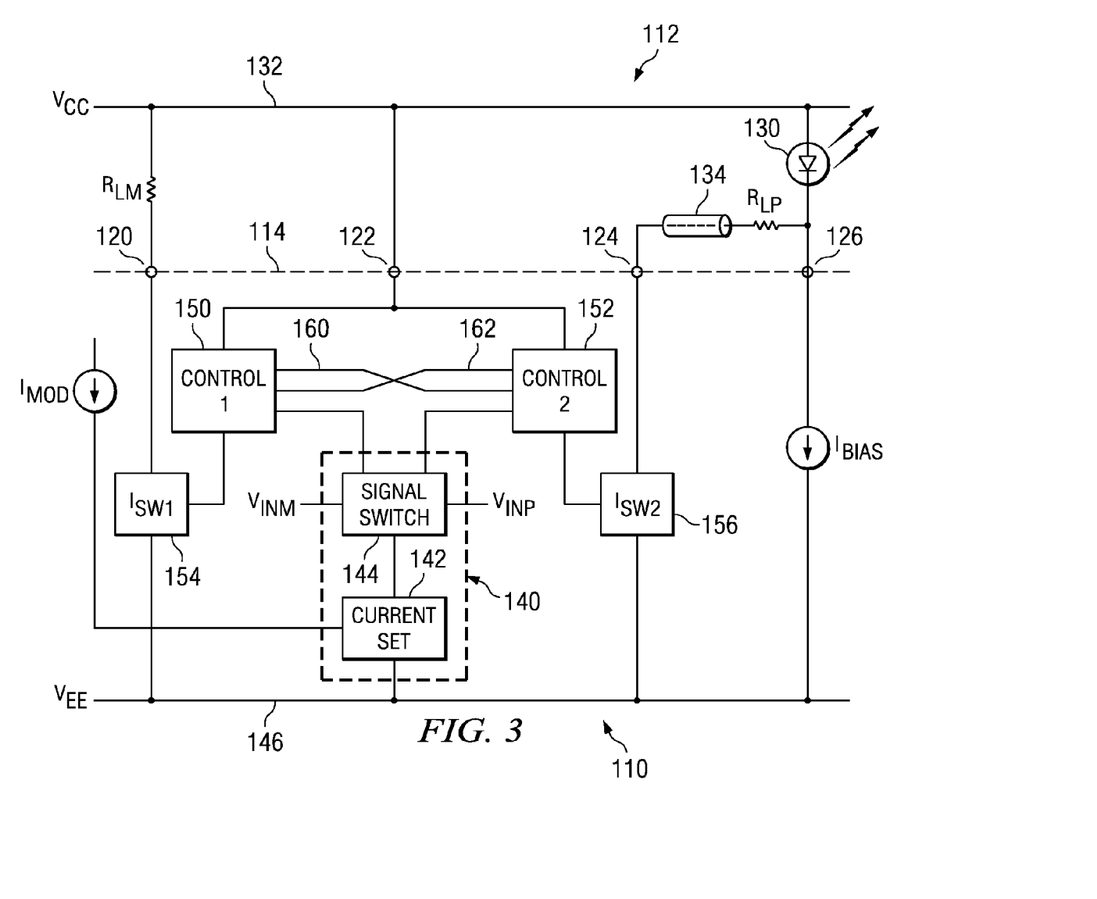
FIG. 3 is a block diagram of the driver apparatus of the present invention.

FIG. 3 is a block diagram of the driver apparatus of the present invention. In FIG. 3, a driver apparatus 110 is configured and connected to drive a driven device 112. A border 114 of driver apparatus 110 is indicated by a dotted line. Driven device 112 is connected with driver apparatus 110 using connecting pins 120, 122, 124, 126. Driven device 112 includes a laser diode 130 coupled with an upper voltage rail 132 at an upper rail potential $V_{CC}$ and coupled with connecting pin 126. Laser diode 130 is also coupled with driver apparatus 110 at a connecting pin 124 via a resistor $R_{LP}$ and a transmission line 134. A resistor $R_{LM}$ is coupled between upper voltage rail 132 and connecting pin 120. Supply voltage $V_{CC}$ is also provided to driver apparatus 110 via a connecting pin 122.

Driver apparatus 110 includes a current source $I_{MOD}$ coupled with a current setting circuit 142 of a signal switching unit 140. Current setting circuit 142 is coupled with a lower voltage rail 146. Current source $I_{MOD}$ may be coupled with upper voltage rail 132 via a connection pin (not shown in FIG. 3). Signal switching unit 140 also includes a signal switching circuit 144 coupled with current setting circuit 142. Signal switching circuit 144 is also coupled with a first control circuit 150 and a second control circuit 152. Control circuits 150, 152 are coupled with connecting pin 122 for receiving supply voltage $V_{CC}$ from upper voltage rail 132.

First control circuit 150 is coupled with a first current generating circuit 154. First control circuit 150 responds to control signals received from signal switching circuit 144 to generate a drive control signal to control operation of first current generating circuit 154. In response to receiving a drive control signal from first control circuit 150, first current generating circuit 154 establishes a current flow between lower voltage rail 146 and upper voltage rail 132 via connecting pin 120 and dummy load resistor $R_{LM}$.

Second control circuit 152 is coupled with a second current generating circuit 156. Second control circuit 152 responds to control signals received from signal switching circuit 144 to generate a drive control signal to control operation of second current generating circuit 156. In response to receiving a drive control signal from second control circuit 152, second current generating circuit 156 establishes a current flow between lower voltage rail 146 and connecting pin 124, thus providing a drive signal for laser diode 130.

Control circuits 150, 152 may be cross-connected via connecting couplers 160, 162 to provide rapid discharge paths for whichever of control circuits 150, 152 is not providing a drive control signal to a current generating circuit 154, 156. When first control circuit 150 is providing a drive control signal to first current generating circuit 154, a fast discharge path is provided to second control circuit 152 via connecting coupling 160. When second control circuit 152 is providing a drive control signal to second current generating circuit 156, a fast discharge path is provided to first control circuit 150 via connecting coupling 162. Alternatively, control circuits 150,152 may provide fast discharge paths internally without any need of cross-connections 160,162.

Driver apparatus 110 also includes a bias current source $I_{BIAS}$ coupled between connecting pin 126 and lower voltage rail 146 for biasing laser diode 130 at a desired current level appropriate to foster fast actuation in response to drive signals received from connecting pin 124.

An important design feature to recognize in driver apparatus 110 is that signal switching circuit 144 is not used to provide a drive signal to driven device 112. Switching circuit 144 is used to drive current generating circuits 154, 156 via control units 150, 152. This design avoids the problems regarding overshoot in the collector currents of a driven differential pair using high speed switching and its attendant distortion of the desired ideal step current waveform for minimizing optical errors by laser diode 130. Because laser diode 130 is driven by a current generating circuit 156, when current generating circuit 156 is embodied in a single transistor, there is only one voltage drop $V_{BE}$ between lower voltage rail 146 and connecting pin 124. This significantly eases the risk of running drive transistors into saturation when operating driver apparatus 110 to drive driven apparatus 112.

Figure 4:
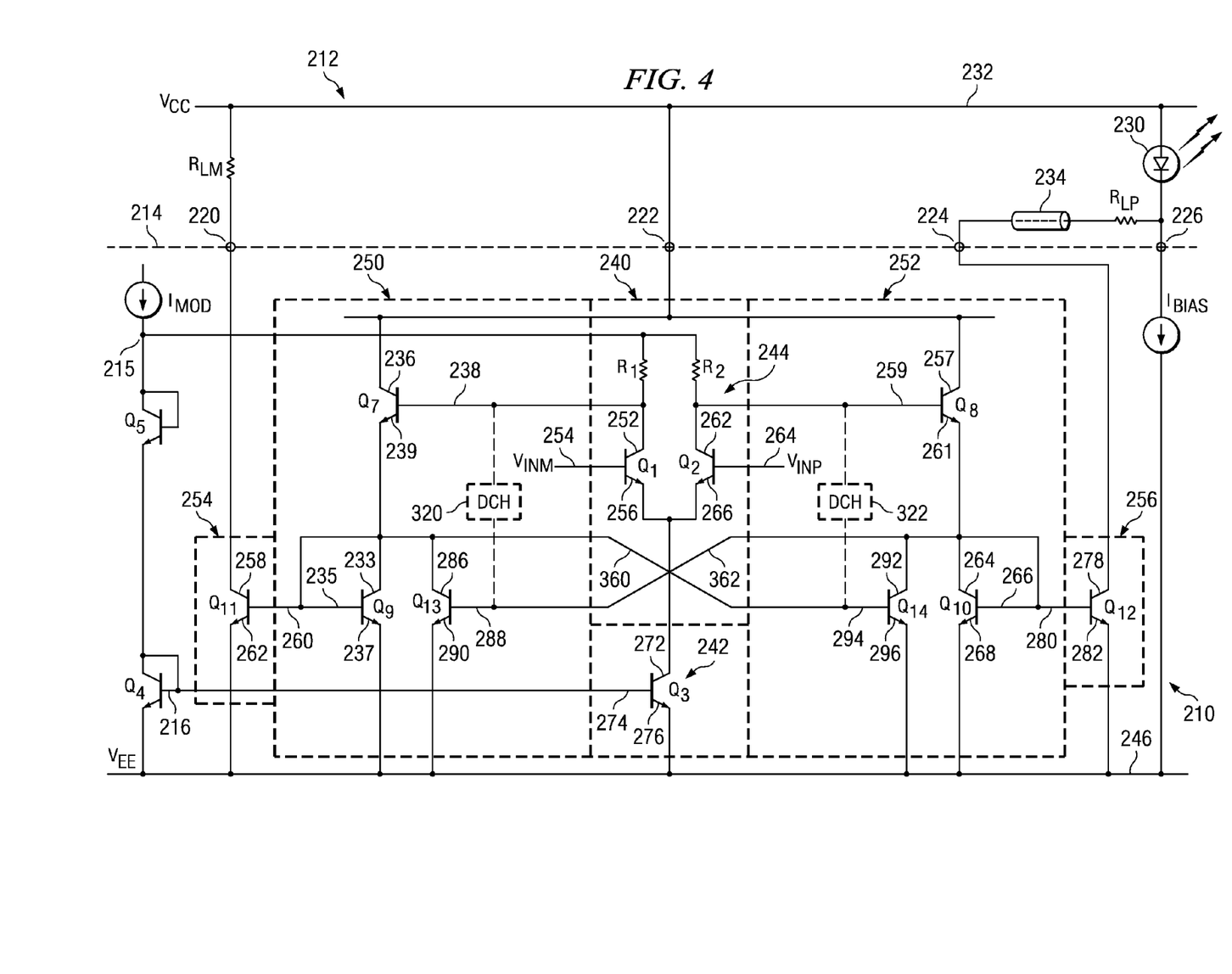
FIG. 4 is an electrical schematic diagram of the preferred embodiment of the driver apparatus of the present invention.

FIG. 4 is an electrical schematic diagram of the preferred embodiment of the driver apparatus of the present invention. In FIG. 4, a driver apparatus 210 is configured and connected to drive a driven device 212. A border 214 of driver apparatus 210 is indicated by a dotted line. Driven device 212 is connected with driver apparatus 210 using connecting pins 220, 222, 224, 226. Driven device 212 includes a laser diode 230 coupled with an upper voltage rail 232 at an upper rail potential $V_{CC}$ and coupled with connecting pin 226. Laser diode 230 is also coupled with driver apparatus 210 at a connecting in 224 via a resistor $R_{LP}$ and a transmission line 234. A resistor $R_{LM}$ is coupled between upper voltage rail 232 and connecting pin 220. Supply voltage $V_{CC}$ is also provided to driver apparatus 210 via a connecting pin 222.

Driver apparatus 210 includes a current source $I_{MOD}$ coupled with a current setting circuit 242 of a signal switching unit 240. Current source $I_{MOD}$ is coupled with a lower voltage rail 246 via transistors $Q_4$, $Q_5$ coupled in series. Lower voltage rail 246 is at a lower voltage potential $V_{EE}$. Each of transistors $Q_4$, $Q_5$ is diode-coupled so that transistors $Q_4$, $Q_5$ cooperate to establish a potential at a circuit locus 215 at two times a base-to-emitter voltage drop (i.e., $2 \cdot V_{BE}$) above lower voltage rail potential $V_{EE}$. Current setting circuit 242 is embodied in a transistor $Q_3$ having a collector 272, a base 274 and an emitter 276. Emitter 276 is coupled with lower voltage rail 246. Current source $I_{MOD}$ may be coupled with upper voltage rail 232 via a connection pin (not shown in FIG. 4).

Driver apparatus 210 also includes a bias current source $I_{BIAS}$ coupled between connecting pin 224 and lower voltage rail 246.

Signal switching unit 240 includes a signal switching circuit 244 in addition to current setting circuit 242. Signal switching circuit 244 includes a differential transistor pair $Q_1$, $Q_2$. Transistor $Q_1$ has a collector 252, a base 254 and an emitter 256. Transistor $Q_2$ has a collector 262, a base 264 and an emitter 266. Collector 252 of transistor $Q_1$ is coupled with connecting circuit locus 215 through resistor $R_1$. Collector 262 of transistor $Q_2$ is coupled with connecting circuit locus 215 through resistor $R_2$. Base 254 of transistor $Q_1$ receives an input signal $V_{INM}$. Base 264 of transistor $Q_2$ receives an input signal $V_{INP}$. Emitters 256, 266 are coupled in common with collector 272 of transistor $Q_3$. Base 274 of transistor $Q_3$ is coupled with base 216 of diode-connected transistor $Q_4$. Transistors $Q_3$, $Q_4$ operate as a current mirror so that current source $I_{MOD}$ effectively sets current that traverses transistor $Q_3$. Emitter 276 of transistor $Q_3$ is coupled with lower voltage rail 246.

Signal switching circuit 244 is also coupled with a first control circuit 250 and a second control circuit 252. Control circuits 250, 252 are coupled with connecting pin 222 for receiving supply voltage $V_{CC}$ from upper voltage rail 232.

First control circuit 250 includes a transistor $Q_7$ coupled in series with a transistor $Q_9$ between connecting pin 222 and lower voltage rail 246. Transistor $Q_7$ has a collector 236, a base 238 and an emitter 239. Transistor $Q_9$ has a collector 233, a base 235 and an emitter 237. Transistor $Q_9$ is diode-coupled with its collector 233 coupled with its base 235. Emitter 237 is coupled with lower voltage rail 246. Emitter 239 of transistor $Q_7$ is coupled with collector 233 of transistor $Q_9$. Collector 236 of transistor $Q_7$ is coupled with connecting pin 222. Base 238 of transistor $Q_7$ is coupled with collector 252 of transistor $Q_1$.

First control circuit 250 is coupled with a first current generating circuit 254. First current generating circuit 254 is embodied in a transistor $Q_{11}$ having a collector 258, a base 260 and an emitter 262. Collector 258 is coupled with connecting in 220. Base 260 is coupled with base 235 of transistor $Q_9$. Emitter 262 is coupled with lower voltage rail 246.

Second control circuit 252 includes a transistor $Q_8$ coupled in series with a transistor $Q_{10}$ between connecting pin 222 and lower voltage rail 246. Transistor $Q_8$ has a collector 257, a base 259 and an emitter 261. Transistor $Q_{10}$ has a collector 264, a base 266 and an emitter 268. Transistor $Q_{10}$ is diode-coupled with its collector 264 coupled with its base 266. Emitter 268 is coupled with lower voltage rail 246. Emitter 261 of transistor $Q_8$ is coupled with collector 264 of transistor $Q_{10}$. Collector 257 of transistor $Q_8$ is coupled with connecting pin 222. Base 259 of transistor $Q_8$ is coupled with collector 262 of transistor $Q_2$.

Second control circuit 252 is coupled with a second current generating circuit 256. Second current generating circuit 256 is embodied in a transistor $Q_{12}$ having a collector 278, a base 280 and an emitter 282. Collector 278 is coupled with connecting pin 224. Base 280 is coupled with base 266 of transistor $Q_{10}$. Emitter 282 is coupled with lower voltage rail 246.

First control circuit 250 responds to control signals received from signal switching unit 240. When input signal $V_{INM}$ is low, transistor $Q_1$ is turned off and the voltage at collector 252 of transistor $Q_1$ is substantially at the $2 \cdot V_{BE}$ voltage at locus 215. In this condition, voltage $2 \cdot V_{BE}$ is applied at base 258 of transistor $Q_7$ so that transistor $Q_7$ is turned on and current flows through transistors $Q_7$, $Q_9$. Because collector 233 is coupled with base 235, and because base 235 is coupled with base 260 of $Q_{11}$, current from emitter 239 turns on transistor $Q_{11}$ and current flows to connecting pin 220 and thence to dummy resistor $R_{LM}$. When input signal $V_{INM}$ is low, input signal $V_{INP}$ is high so that transistor $Q_2$ is turned on and current flows through resistor $R_2$. The collector current effects a voltage drop across resistor $R_2$ of a sufficient amount that the potential at collector 262 of transistor $Q_2$ minus the $V_{BE}$ of $Q_8$ is too low to turn on transistors $Q_{10}$ or $Q_{12}$. As a consequence, no current flows to turn on transistor $Q_{12}$ and no current is provided to connecting pin 224 or to laser diode 230.

This is the situation illustrated in the vicinity of times $t_1$ and $t_5$ in FIG. 2. That is, when using driver apparatus 210 to drive driven device 212 (illustrated in FIG. 4), laser diode 230 will not illuminate in the vicinity of times $t_1$, $t_5$ because current is provided to dummy resistor $R_{LM}$ and (as will be described below) current is not being provided to connecting pin 224, and hence is not provided to laser diode 230.

Second control circuit 252 responds to control signals received from signal switching unit 240. When input signal $V_{INP}$ is low, transistor $Q_2$ is turned off and the voltage at collector 262 of transistor $Q_2$ is substantially at the $2 \cdot V_{BE}$ voltage at locus 215. In this condition, voltage $2 \cdot V_{BE}$ is applied at base 259 of transistor $Q_8$ so that transistor $Q_8$ is turned on and current flows through transistors $Q_8$, $Q_{10}$. Because collector 264 is coupled with base 266, and because base 266 is coupled with base 280 of $Q_{12}$, current from emitter 2261 turns on transistor $Q_{12}$ and current flows to connecting pin 224 and thence to laser diode 230. When input signal $V_{INP}$ is low, input signal $V_{INM}$ is high so that transistor $Q_1$ is turned on and current flows through resistor $R_1$. The collector current effects a voltage drop across resistor $R_1$ of a sufficient amount that the potential at collector 252 of transistor $Q_1$ minus the $V_{BE}$ of $Q_7$ is too low to turn on transistors $Q_9$ or $Q_{11}$. As a consequence, no current flows to turn on transistor $Q_{11}$ and no current is provided to connecting pin 220 or to dummy resistor $R_{LM}$.

This is the situation illustrated in the vicinity of time $t_3$ in FIG. 2. That is, when using driver apparatus 210 to drive driven device 212 (illustrated in FIG. 4), laser diode 230 will illuminate in the vicinity of time $t_3$ because current is provided to laser diode 230 and current is not being provided to connecting pin 220, and hence is not provided to dummy resistor $R_{LM}$.

First control circuit 250 also includes a transistor $Q_{13}$. Transistor $Q_{13}$ has a collector 286, a base 288 and an emitter 290. Collector 286 is coupled with base 260 of transistor $Q_{11}$. Base 288 is coupled with emitter 261 of transistor $Q_8$. Emitter 290 is coupled with lower voltage rail 246.

Second control circuit 252 also includes a transistor $Q_{14}$. Transistor $Q_{14}$ has a collector 292, a base 294 and an emitter 296. Collector 292 is coupled with base 280 of transistor $Q_{12}$. Base 294 is coupled with emitter 239 of transistor $Q_7$. Emitter 296 is coupled with lower voltage rail 246.

Transistors $Q_{13}$, $Q_{14}$ cooperate to provide fast discharge paths for current generating circuits 254, 256. Base 235 of transistor $Q_{11}$ and emitter 239 of transistor $Q_7$ are coupled with base 294 of transistor $Q_{14}$ via a line 360. Base 280 of transistor $Q_{12}$ and emitter 261 of transistor $Q_8$ are coupled with base 288 of transistor $Q_{13}$ via a line 362. When current generator 256 is gated by current from emitter 261 of transistor $Q_8$, the current that turns on transistor $Q_{12}$ (which embodies current generating circuit 256) is also applied to base 288 of transistor $Q_{13}$. Thus, as transistor $Q_{12}$ is turning on, so is transistor $Q_{13}$. When transistor $Q_{13}$ is turned on a current path is established between base 260 of transistor $Q_{11}$ and lower voltage rail 246 that speeds discharge of base 260. Speed of operation of driver apparatus 210 is thereby improved. When current generator 254 is gated by current from emitter 239 of transistor $Q_7$, the current that turns on transistor $Q_{11}$ (which embodies current generating circuit 254) is also applied to base 294 of transistor $Q_{14}$. Thus, as transistor $Q_{11}$ is turning on, so is transistor $Q_{14}$. When transistor $Q_{14}$ is turned on a current path is established between base 280 of transistor $Q_{12}$ and lower voltage rail 246 that speeds discharge of base 280. Speed of operation of driver apparatus 210 is thereby improved.

In an alternate embodiment, lines 360, 362 will not connect with bases 288, 294 of transistors $Q_{13}$, $Q_{14}$. In this alternate embodiment, a first discharge control circuit 320 is included in first control circuit 250 and a second discharge control circuit 322 is included in second control circuit 252 to provide fast discharge paths internally without any need of cross-connecting lines 360, 362. Discharge control circuits 320. 322 and their respective connections are illustrated in dotted line format to indicate their being an alternate embodiment. First discharge control circuit 320 is coupled between base 238 of transistor $Q_7$ and coupled with base 288 of transistor $Q_{13}$. When first discharge control circuit 320 senses a decrease in voltage present at base 238, a signal is provided to base 288 to turn on transistor $Q_{13}$. Thus, as transistor $Q_7$ is turning off, transistor $Q_{13}$ is turning on. When transistor $Q_{13}$ is turned on a current path is established between base 260 of transistor $Q_{11}$ and lower voltage rail 246 that speeds discharge of base 260. Speed of operation of driver apparatus 210 is thereby improved. Second discharge control circuit 322 is coupled between base 258 of transistor $Q_8$ and coupled with base 294 of transistor $Q_{14}$. When second discharge control circuit 322 senses a decrease in voltage present at base 259, a signal is provided to base 294 to turn on transistor $Q_{14}$. Thus, as transistor $Q_8$ is turning off, transistor $Q_{14}$ is turning on. When transistor $Q_{14}$ is turned on a current path is established between base 280 of transistor $Q_{12}$ and lower voltage rail 246 that speeds discharge of base 280. Speed of operation of driver apparatus 210 is thereby improved.

An important design feature to recognize in driver apparatus 210 is that signal switching circuit 244 is not used to provide a drive signal to driven device 212. Switching circuit 244 is used to drive current generating circuits 254, 256 via control units 250, 252. This design avoids the problems regarding overshoot in the collector currents of a driven differential pair using high speed switching and its attendant distortion of the desired ideal step current waveform for minimizing optical errors by laser diode 230. Because laser diode 230 is driven by a current generating circuit 256, when current generating circuit 256 is embodied in a single transistor $Q_{12}$, there is only one voltage drop $V_{BE}$ between lower voltage rail 246 and connecting pin 224. This significantly eases the risk of running out of headroom when operating driver apparatus 210 to drive driven apparatus 212.

Figure 5:
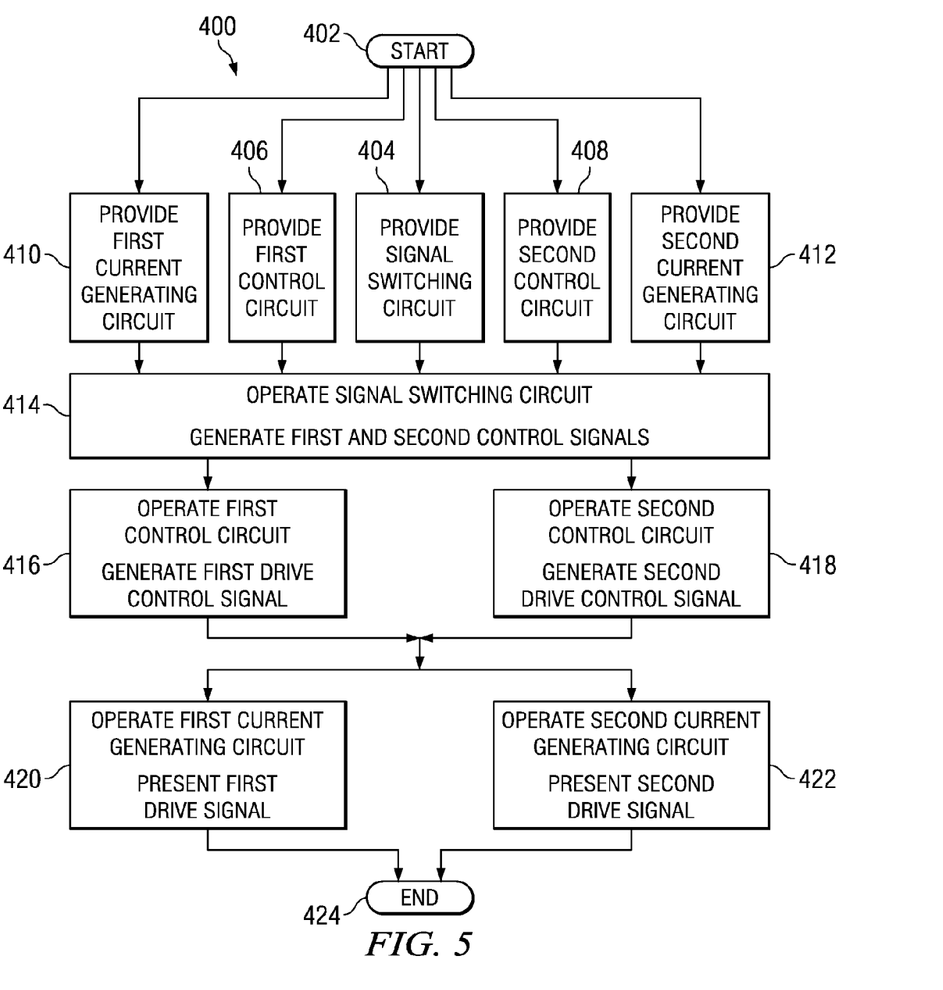
FIG. 5 is a flow chart illustrating the method of the present invention.

FIG. 5 is a flow chart illustrating the method of the present invention. In FIG. 5, a method 400 for providing a drive signal begins at a START locus 402. Method 400 continues with the step of, in no particular order: (1) providing a signal switching circuit coupled for receiving an actuation signal, as indicated by a block 404; (2) providing a first control circuit coupled with the signal switching circuit, as indicated by a block 406; (3) providing a second control circuit coupled with the signal switching circuit, as indicated by a block 408; (4) providing a first current generating circuit coupled with the first control circuit and coupled with a lower voltage rail, as indicated by a block 410; and (5) providing a second current generating circuit coupled with the second control circuit and coupled with the lower voltage rail, as indicated by a block 412.

Method 400 continues with the step of operating the signal switching circuit to generate a first control signal and a second control signal in response to the actuation signal, as indicated by a block 414. Method 400 continues with the step of, in no particular order: (1) operating the first control circuit to generate a first drive control signal in response to the first control signal, as indicated by a block 416; and (2) operating the second control circuit to generate a second drive control signal in response to the second control signal, as indicated by a block 418. Method 400 continues with the step of, in no particular order: (1) operating the first current generating circuit to present a first drive signal at a first output locus in response to the first drive control signal, as indicated by a block 420; and (2) the second current generating circuit to present a second drive signal at a second output locus in response to the second drive control signal, as indicated by a block 422. Method 400 terminates at an END locus 424.

It is to be understood that, while the detailed drawings and specific examples given describe preferred embodiments of the invention, they are for the purpose of illustration only, that the apparatus and method of the invention are not limited to the precise details and conditions disclosed and that various changes may be made therein without departing from the spirit of the invention which is defined by the following claims.

I claim:

1. An apparatus for providing a drive signal for a device; said drive signal being related to a received signal; the apparatus operating between an upper voltage rail and a lower voltage rail; the apparatus comprising:
   (a) a signal switching circuit; said signal switching circuit receiving said received signal and presenting a control signal at at least one control output node; said control signal being related to said received signal;
   (b) at least one control circuit coupled with said signal switching circuit; said at least one control circuit responding to said at least one control signal for generating at least one drive control signal;
   (c) at least one current generating circuit coupled with said at least one control circuit, coupled with at least one output node and coupled with said lower voltage rail; said at least one current generating circuit responding to said at least one drive control signal to present said drive signal at said at least one output node; a selected output node of said at least one output node being coupled with said device,
   wherein said at least one control circuit is a first control circuit generating a first said drive control signal and a second control circuit generating a second said drive control signal; said first control circuit enabling a signal path for faster discharge by said second control circuit when said first control circuit is generating said first drive control signal; said second control circuit enabling a signal path for faster discharge by said first control circuit when said second control circuit is generating said second drive control signal.

2. An apparatus for providing a drive signal at an output node as recited in claim 1 wherein said at least one control circuit is coupled with said upper voltage rail.

3. An apparatus for providing a drive signal at an output node as recited in claim 2 wherein said at least one control circuit is a first control circuit generating a first said drive control signal and a second control circuit generating a second said drive control signal, wherein said at least one current generating circuit is a first current generating circuit coupled with said first control circuit and a second current generating circuit coupled with said second control circuit and wherein said at least one output node is a first output node and a second output node; said first current generating circuit responding to said first drive control signal for presenting said drive signal at said first output node; said first output node being said selected output node; said second current generating circuit responding to said second drive control signal for presenting said drive signal at said second output node; said second output node being coupled with a load other than said device.

4. An apparatus for providing a drive signal at an output node as recited in claim 1 wherein said at least one current generating circuit is a first current generating circuit coupled with said first control circuit and a second current generating circuit coupled with said second control circuit and wherein said at least one output node is a first output node and a second output node; said first current generating circuit responding to said first drive control signal for presenting said drive signal at said first output node; said first output node being said selected output node; said second current generating circuit responding to said second drive control signal for presenting said drive signal at said second output node; said second output node being coupled with a load other than said device.

5. An apparatus for providing a drive signal at an output node as recited in claim 2 wherein said at least one control circuit is a first control circuit generating a first said drive control signal and a second control circuit generating a second said drive control signal; said first control circuit enabling a signal path for faster discharge by said first control circuit when said second control circuit is generating said second drive control signal; said second control circuit enabling a signal path for faster discharge by said second control circuit when said first control circuit is generating said first drive control signal.

6. An apparatus for providing a drive signal at an output node as recited in claim 5 wherein said at least one current generating circuit is a first current generating circuit coupled with said first control circuit and a second current generating circuit coupled with said second control circuit and wherein said at least one output node is a first output node and a second output node; said first current generating circuit responding to said first drive control signal for presenting said drive signal at said first output node; said first output node being said selected output node; said second current generating circuit responding to said second drive control signal for presenting said drive signal at said second output node; said second output node being coupled with a load other than said device.

7. An apparatus for providing a drive signal for a device; said drive signal being related to a received signal; the apparatus operating between an upper voltage rail and a lower voltage rail; the apparatus comprising:
(a) a signal switching circuit; said signal switching circuit receiving said received signal and presenting a control signal at at least one control output node; said control signal being related to said received signal;
(b) at least one control circuit coupled with said signal switching circuit; said at least one control circuit responding to said at least one control signal for generating at least one drive control signal;
(c) at least one current generating circuit coupled with said at least one control circuit, coupled with at least one output node and coupled with said lower voltage rail; said at least one current generating circuit responding to said at least one drive control signal to present said drive signal at said at least one output node; a selected output node of said at least one output node being coupled with said device,
wherein said at least one control circuit is a first control circuit generating a first said drive control signal and a second control circuit generating a second said drive control signal, wherein said at least one current generating circuit is a first current generating circuit coupled with said first control circuit and a second current generating circuit coupled with said second control circuit and wherein said at least one output node is a first output node and a second output node; said first current generating circuit responding to said first drive control signal for presenting said drive signal at said first output node; said first output node being said selected output node; said second current generating circuit responding to said second drive control signal for presenting said drive signal at said second output node; said second output node being coupled with a load other than said device.

8. An apparatus for providing a drive signal at an output node as recited in claim 7 wherein said at least one control circuit is a first control circuit generating a first said drive control signal and a second control circuit generating a second said drive control signal; said first control circuit enabling a signal path for faster discharge by said second control circuit when said first control circuit is generating said first drive control signal; said second control circuit enabling a signal path for faster discharge by said first control circuit when said second control circuit is generating said second drive control signal.

9. An apparatus for providing a drive signal for a device; said drive signal being related to a received signal; the apparatus operating between an upper voltage rail and a lower voltage rail; the apparatus comprising:
(a) a signal switching circuit; said signal switching circuit receiving said received signal and presenting a control signal at at least one control output node; said control signal being related to said received signal;
(b) at least one control circuit coupled with said signal switching circuit; said at least one control circuit responding to said at least one control signal for generating at least one drive control signal;
(c) at least one current generating circuit coupled with said at least one control circuit, coupled with at least one output node and coupled with said lower voltage rail; said at least one current generating circuit responding to said at least one drive control signal to present said drive signal at said at least one output node; a selected output node of said at least one output node being coupled with said device,
wherein said at least one control circuit is a first control circuit generating a first said drive control signal and a second control circuit generating a second said drive control signal; said first control circuit enabling a signal path for faster discharge by said first control circuit when said second control circuit is generating said second drive control signal; said second control circuit enabling a signal path for faster discharge by said second control circuit when said first control circuit is generating said first drive control signal.

10. A driver apparatus comprising:
(a) a signal switching circuit coupled for receiving an actuation signal; said signal switching circuit generating a first control signal and a second control signal in response to said actuation signal;
(b) a first control circuit coupled with said signal switching circuit; said first control circuit generating a first drive control signal in response to said first control signal;
(c) a second control circuit coupled with said signal switching circuit; said second control circuit generating a second drive control signal in response to said second control signal;
(d) a first current generating circuit coupled with said first control circuit and coupled with a lower voltage rail; said first current generating circuit presenting a first drive signal at a first output node in response to said first drive control signal;
(e) a second current generating circuit coupled with said second control circuit and coupled with said lower voltage rail; said second current generating circuit presenting a second drive signal at a second output node in response to said second drive control signal,
wherein said at least one current generating circuit is a first current generating circuit coupled with said first control circuit and a second current generating circuit coupled with said second control circuit and wherein said at least one output node is a first output node and a second output node; said first current generating circuit responding to said first drive control signal for presenting said drive signal at said first output node; said first output node being said selected output node; said second current generating circuit responding to said second drive control signal for presenting said drive signal at said second output node; said second output node being coupled with a load other than said device.

11. A driver apparatus comprising:
(a) a signal switching circuit coupled for receiving an actuation signal; said signal switching circuit generating a first control signal and a second control signal in response to said actuation signal;

(b) a first control circuit coupled with said signal switching circuit; said first control circuit generating a first drive control signal in response to said first control signal;

(c) a second control circuit coupled with said signal switching circuit; said second control circuit generating a second drive control signal in response to said second control signal;

(d) a first current generating circuit coupled with said first control circuit and coupled with a lower voltage rail; said first current generating circuit presenting a first drive signal at a first output node in response to said first drive control signal;

(e) a second current generating circuit coupled with said second control circuit and coupled with said lower voltage rail; said second current generating circuit presenting a second drive signal at a second output node in response to said second drive control signal, wherein said first control circuit and said second control circuit are coupled; said first control circuit enabling a signal path for faster discharge by said second control circuit when said first control circuit is generating said first drive control signal; said second control circuit enabling a signal path for faster discharge by said first control circuit when said second control circuit is generating said second drive control signal.

12. A driver apparatus as recited in claim 11 wherein said first control circuit and said second control circuit are coupled with an upper voltage rail.

13. A driver apparatus as recited in claim 12 wherein said first control circuit enables a signal path for faster discharge by said first control circuit when said second control circuit is generating said second drive control signal; and wherein said second control circuit enables a signal path for faster discharge by said second control circuit when said first control circuit is generating said first drive control signal.

14. A driver apparatus comprising:

(a) a signal switching circuit coupled for receiving an actuation signal; said signal switching circuit generating a first control signal and a second control signal in response to said actuation signal;

(b) a first control circuit coupled with said signal switching circuit; said first control circuit generating a first drive control signal in response to said first control signal;

(c) a second control circuit coupled with said signal switching circuit; said second control circuit generating a second drive control signal in response to said second control signal;

(d) a first current generating circuit coupled with said first control circuit and coupled with a lower voltage rail; said first current generating circuit presenting a first drive signal at a first output node in response to said first drive control signal;

(e) a second current generating circuit coupled with said second control circuit and coupled with said lower voltage rail; said second current generating circuit presenting a second drive signal at a second output node in response to said second drive control signal, said first control circuit enabling a signal path for faster discharge by said second control circuit when said first control circuit is generating said first drive control signal; said second control circuit enabling a signal path for faster discharge by said first control circuit when said second control circuit is generating said second drive control signal.

15. A driver apparatus comprising:

(a) a signal switching circuit coupled for receiving an actuation signal; said signal switching circuit generating a first control signal and a second control signal in response to said actuation signal;

(b) a first control circuit coupled with said signal switching circuit; said first control circuit generating a first drive control signal in response to said first control signal;

(c) a second control circuit coupled with said signal switching circuit; said second control circuit generating a second drive control signal in response to said second control signal;

(d) a first current generating circuit coupled with said first control circuit and coupled with a lower voltage rail; said first current generating circuit presenting a first drive signal at a first output node in response to said first drive control signal;

(e) a second current generating circuit coupled with said second control circuit and coupled with said lower voltage rail; said second current generating circuit presenting a second drive signal at a second output node in response to said second drive control signal, wherein said first control circuit enables a signal path for faster discharge by said first control circuit when said second control circuit is generating said second drive control signal; and wherein said second control circuit enables a signal path for faster discharge by said second control circuit when said first control circuit is generating said first drive control signal.

16. A method for providing a drive signal; the method comprising the steps of:

(a) in no particular order:
  (1) providing a signal switching circuit coupled for receiving an actuation signal;
  (2) providing a first control circuit coupled with said signal switching circuit;
  (3) providing a second control circuit coupled with said signal switching circuit;
  (4) providing a first current generating circuit coupled with said first control circuit and coupled with a lower voltage rail; and
  (5) providing a second current generating circuit coupled with said second control circuit and coupled with said lower voltage rail;

(b) operating said signal switching circuit to generate a first control signal and a second control signal in response to said actuation signals;

(c) in no particular order:
  (1) operating said first control circuit to generate a first drive control signal in response to said first control signal; and
  (2) operating said second control circuit to generate a second drive control signal in response to said second control signal;

(d) in no particular order:
  (1) operating said first current generating circuit to present a first drive signal at a first output node in response to said first drive control signal; and
  (2) said second current generating circuit to present a second drive signal at a second output node in response to said second drive control signal, wherein said first control circuit and said second control circuit are coupled; said first control circuit enabling a signal path for faster discharge by said second control circuit when said first control circuit is generating said first drive control signal; said second control circuit enabling a signal path for faster discharge by said first control circuit when said second control circuit is generating said second drive control signal.

17. A method for providing a drive signal as recited in claim 16 wherein said first control circuit and said second control circuit are coupled with an upper voltage rail.

18. A method for providing a drive signal as recited in claim 16 wherein said first control circuit enables a signal path for faster discharge by said first control circuit when said second control circuit is generating said second drive control signal; and wherein said second control circuit enables a signal path for faster discharge by said second control circuit when said first control circuit is generating said first drive control signal.

19. A method for providing a drive signal as recited in claim 17 wherein said first control circuit enables a signal path for faster discharge by said first control circuit when said second control circuit is generating said second drive control signal; and wherein said second control circuit enables a signal path for faster discharge by said second control circuit when said first control circuit is generating said first drive control signal.

\* \* \* \* \*